(12) United States Patent
Wakabayashi et al.

(10) Patent No.: US 11,549,179 B2
(45) Date of Patent: Jan. 10, 2023

(54) FILM FORMING METHOD

(71) Applicant: Tokyo Electron Limited, Tokyo (JP)

(72) Inventors: Satoshi Wakabayashi, Nirasaki (JP); Yuka Goto, Nirasaki (JP); Daisuke Hojo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/318,321

(22) Filed: May 12, 2021

(65) Prior Publication Data
US 2021/0363638 A1  Nov. 25, 2021

(30) Foreign Application Priority Data
May 19, 2020  (JP) .............................. JP2020-087635

(51) Int. Cl.
*C23C 16/06* (2006.01)
*C23C 16/40* (2006.01)
*C23C 16/455* (2006.01)
*C23C 16/30* (2006.01)
*C23C 16/458* (2006.01)

(52) U.S. Cl.
CPC ...... *C23C 16/45527* (2013.01); *C23C 16/303* (2013.01); *C23C 16/4586* (2013.01); *C23C 16/45548* (2013.01); *C23C 16/45557* (2013.01)

(58) Field of Classification Search
CPC .................. C23C 16/06; C23C 16/303; C23C 16/4586; C23C 16/40
See application file for complete search history.

(56) References Cited

U.S. PATENT DOCUMENTS

| 6,300,664 B1* | 10/2001 | Kuroi | H01L 29/518 257/E29.151 |
| 6,498,107 B1* | 12/2002 | Fenner | H01L 21/02247 438/712 |
| 2003/0232511 A1* | 12/2003 | Metzner | H01L 21/02274 438/785 |
| 2012/0223338 A1* | 9/2012 | Mitani | H01L 29/518 257/77 |
| 2013/0234148 A1* | 9/2013 | Werkhoven | H01L 21/76251 257/E29.089 |
| 2014/0370192 A1* | 12/2014 | Odedra | C23C 16/18 427/255.6 |

(Continued)

FOREIGN PATENT DOCUMENTS

| JP | H01-094657 A | 4/1989 |
| JP | 2000-160342 A | 6/2000 |

(Continued)

OTHER PUBLICATIONS

Seghete, D., et al., "Molybdenum Atomic Layer Deposition Using MoF6 and Si2H6 as the Reactants". Chemistry of Materials, 2011, 23, 1668-1678.*

Diskus, Madeleine, et al., "Growth of thin films of molybdenum oxide by atomic layer deposition". Journal of Materials Chemistry, 2011, 21, 705-710.*

(Continued)

*Primary Examiner* — Bret P Chen
(74) *Attorney, Agent, or Firm* — Armstrong Teasdale LLP

(57) ABSTRACT

A film forming method includes: (a) preparing a substrate having an oxide layer formed on the substrate; (b) supplying a nitrogen-containing gas to the substrate heated by a heater; and (c) forming a molybdenum film on the oxide layer by alternately supplying a raw material gas containing molybdenum and a reducing gas a plurality of times.

13 Claims, 10 Drawing Sheets

(56) References Cited

U.S. PATENT DOCUMENTS

| | | | |
|---|---|---|---|
| 2016/0002786 A1* | 1/2016 | Gatineau | H01L 21/02205 |
| | | | 427/255.394 |
| 2017/0121356 A1* | 5/2017 | Garratt | C23C 16/45553 |
| 2019/0003050 A1* | 1/2019 | Dezelah | C23C 16/16 |
| 2019/0164768 A1* | 5/2019 | Narushima | C23C 16/45553 |
| 2019/0221434 A1* | 7/2019 | Sameshima | C23C 16/4408 |
| 2021/0057223 A1* | 2/2021 | Stevens | C23C 16/45523 |
| 2021/0238736 A1* | 8/2021 | Butail | C23C 16/0272 |

FOREIGN PATENT DOCUMENTS

| | | | | |
|---|---|---|---|---|
| WO | WO 2010/114386 A1 * | 10/2010 | | C23C 16/40 |
| WO | WO 2020/023790 A1 * | 1/2020 | | C23C 16/455 |

OTHER PUBLICATIONS

Mattinen, Miika, et al., "Atomic layer deposition of crystalline molybdenum oxide thin films and phase control by post-deposition annealing". Materials Today Chemistry 9 (2018) 17-27.*

Miikkulainen, Ville, et al., "Atomic Layer Deposition of Molybdenum Nitride from Bis(tert-butylimido)-bis(dimethylamido)molybdenum and Ammonia onto Several Types of Substrate Materials with Equal Growth per Cycle". Chemistry of Materials, 2007, 19, 263-269.*

Biswas, Abhijit, et al., "Atomically flat single terminated oxide substrate surfaces". Progress in Surface Science 92 (2017) 117-141.*

Attrash, Mohammed, et al., "Nitrogen-Terminated Polycrystalline Diamond Surfaces by Microwave Chemical Vapor Deposition: Thermal Stability, Chemical States, and Electronic Structure". The Journal of Physical Chemistry C, 2020, 124, 5657-5664.*

* cited by examiner

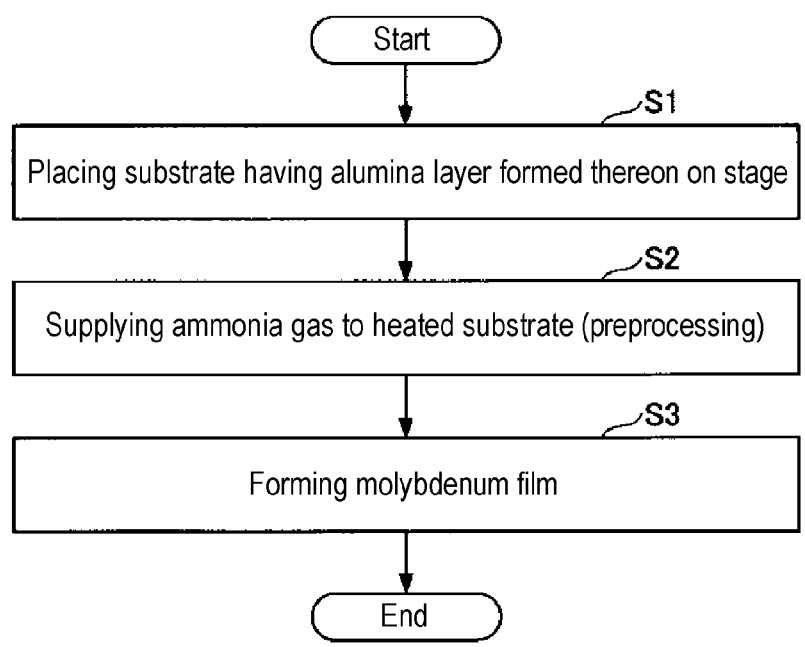

FILM FORMING METHOD

CROSS-REFERENCE TO RELATED APPLICATION

This application is based upon and claims the benefit of priority from Japanese Patent Application No. 2020-087635, filed on May 19, 2020, the entire contents of which are incorporated herein by reference.

TECHNICAL FIELD

The present disclosure relates to a film forming method and a film forming apparatus.

BACKGROUND

For example, Patent Document 1 proposes, when forming a molybdenum film on an insulating layer, forming a base film by a sputtering method without directly forming the molybdenum film and nitriding the base film by a heat treatment in a nitriding gas atmosphere or an ammonia gas atmosphere.

For example, Patent Document 2 proposes terminating a surface of a silicon substrate by oxygen or nitrogen atoms and forming a molybdenum film thereon by using $MoCl_5$ gas and $H_2$ gas.

PRIOR ART DOCUMENTS

Patent Documents

Patent Document 1: Japanese Laid-Open Patent Publication No. H1-94657
Patent Document 2: Japanese Laid-Open Patent Publication No. 2000-160342

SUMMARY

According to an aspect of the present disclosure, a film forming method includes: (a) preparing a substrate having an oxide layer formed on the substrate; (b) supplying a nitrogen-containing gas to the substrate heated by a heater; and (c) forming a molybdenum film on the oxide layer by alternately supplying a raw material gas containing molybdenum and a reducing gas a plurality of times.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a flowchart illustrating a flow of respective processes of a film forming method according to an embodiment.

DETAILED DESCRIPTION

Figure 1:
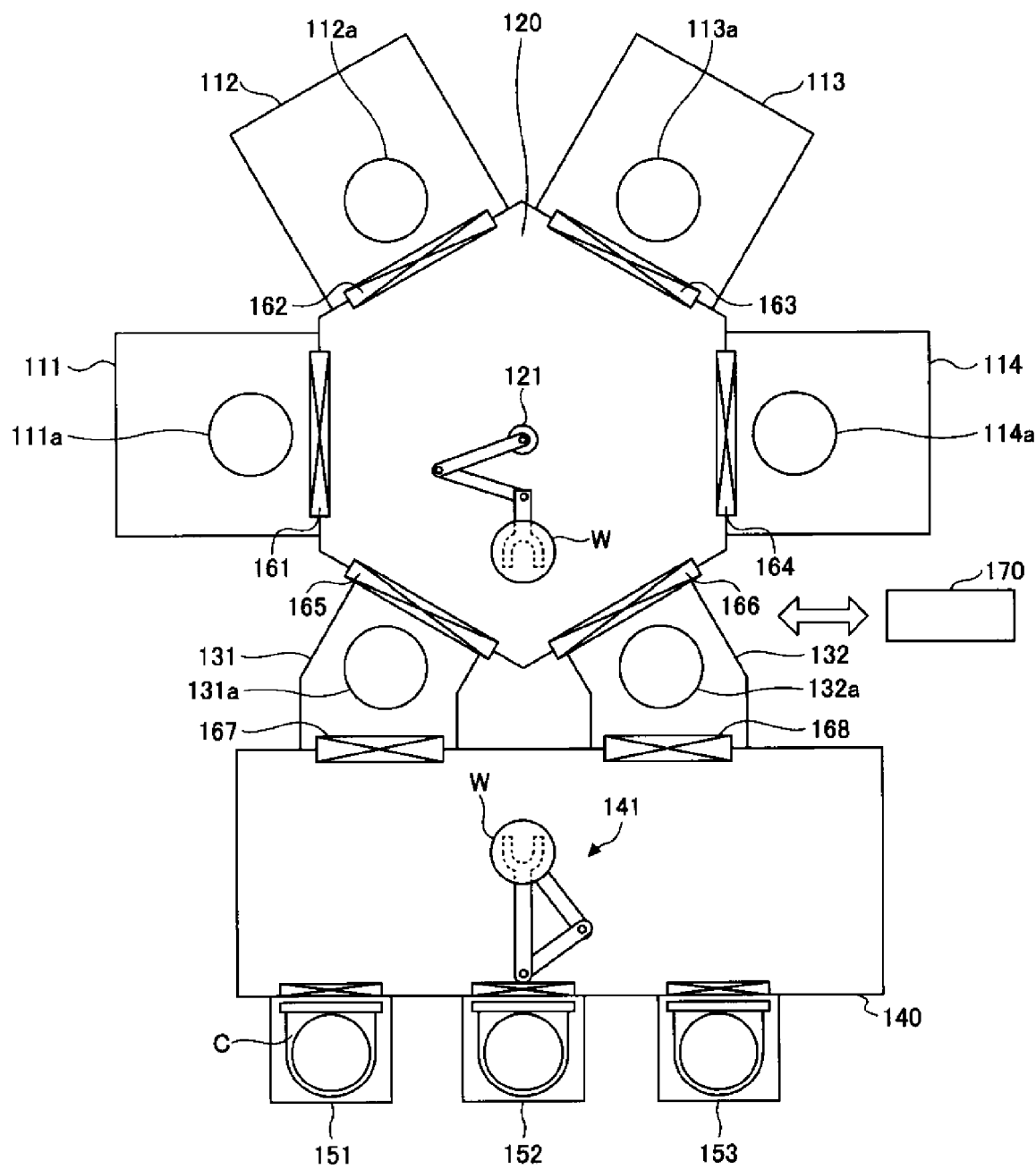
FIG. 1 is a schematic plan view of a processing system used in a film forming method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

[Processing System]

First, a processing system used in a film forming method according to an embodiment will be described with reference to FIG. 1. FIG. 1 is a schematic plan view illustrating a processing system used in a film forming method according to an embodiment.

The processing system includes processing chambers 111 to 114, a vacuum transfer chamber 120, load lock chambers 131 and 132, an atmospheric transfer chamber 140, load ports 151 to 153, gate valves 161 to 168, and a controller 170.

The processing chamber 111 has a stage 111a configured to place a substrate W, for example, a wafer, thereon, and is connected to the vacuum transfer chamber 120 via the gate valve 161. The processing chamber 112 has a stage 112a configured to place a substrate W thereon, and is connected to the vacuum transfer chamber 120 via the gate valve 162. The processing chamber 113 has a stage 113a configured to place a substrate W thereon, and is connected to the vacuum transfer chamber 120 via the gate valve 163. The processing chamber 114 has a stage 114a configured to place a substrate W thereon, and is connected to the vacuum transfer chamber 120 via the gate valve 164. The interiors of the processing chambers 111 to 114 are depressurized to predetermined vacuum atmospheres, and the substrates W in the processing chambers 111 to 114 are subjected to desired processing, such as film formation.

The interior of the vacuum transfer chamber 120 is depressurized to a predetermined vacuum atmosphere. A transfer mechanism 121 is provided in the vacuum transfer chamber 120. The transfer mechanism 121 transfers substrates W with respect to the processing chambers 111 to 114 and the load lock chambers 131 and 132.

The load lock chamber 131 has a stage 131a configured to place a substrate W thereon, and is connected to the vacuum transfer chamber 120 via the gate valve 165 and connected to the atmospheric transfer chamber 140 via the gate valve 167. The load lock chamber 132 has a stage 132a configured to place a substrate W thereon, and is connected to the vacuum transfer chamber 120 via the gate valve 166 and connected to the atmospheric transfer chamber 140 via the gate valve 168. The interior of each of the load lock chambers 131 and 132 is configured to be switchable between atmospheric atmosphere and a vacuum atmosphere.

The interior of the atmospheric transfer chamber 140 is atmospheric atmosphere and, for example, a downflow of clean air is formed in the atmospheric transfer chamber 40. The atmospheric transfer chamber 140 is provided with a transfer mechanism 141. The transfer mechanism 141 transfers substrates W with respect to the load lock chambers 131 and 132 and carriers C in load ports 151 to 153.

The load ports 151 to 153 are provided on a wall surface of a long side of the atmospheric transfer chamber 140. A carrier C accommodating substrates W or an empty carrier C is mounted in each of the load ports 151 to 153. As the carriers C, for example, front opening unified pods (FOUPs) may be used.

The controller 170 controls the entirety of the processing system by performing, for example, operations of the processing chambers 111 to 114, operations of the transfer mechanisms 121 and 141, opening and closing of the gate valves 161 to 168, and switching between the vacuum atmosphere and atmospheric atmosphere in the load lock chambers 131 and 132. For example, the controller 170 opens the gate valve 167 and controls the transfer mechanism 141 to transfer the substrate W accommodated in the carrier C of, for example, the load port 151 to the stage 131a of the load lock chamber 131. The controller 170 closes the gate valve 167, and creates a vacuum atmosphere inside the load lock chamber 131.

The controller 170 opens the gate valves 161 and 165, and controls the transfer mechanism 121 to transfer the substrate W in the load lock chamber 131 to the stage 111a of the processing chamber 111. The controller 170 closes the gate valves 161 and 165 and operates the processing chamber 111. Thus, a treatment processing (preprocessing) as a surface treatment of the substrate W is performed in the processing chamber 111.

Subsequently, the controller 170 opens the gate valves 161 and 162, and controls the transfer mechanism 121 to transfer the substrate W, which has been processed in the processing chamber 111, to the stage 112a of the processing chamber 112. The controller 170 closes the gate valves 161 and 162 and operates the processing chamber 112. Thus, a molybdenum film is formed on the substrate W in the processing chamber 112.

The controller 170 may transfer the substrate W, which has been processed in the processing chamber 111, to another processing chamber 113 or 114 capable of performing the same processing as the processing chamber 112. The treatment processing and formation of a molybdenum film may be performed on the substrate W in the processing chamber 111. In this case, the controller 170 can shorten a transfer time, thereby increasing throughput. The treatment processing as the preprocessing and the film formation may be performed in the same processing chamber among the processing chambers 111 to 114, or may be performed in parallel in each of the processing chambers 111 to 114. This makes it possible to improve productivity.

The controller 170 controls the transfer mechanism 121 to transfer the processed substrate W to the load lock chamber 131 or the load lock chamber 132. The controller 170 creates atmospheric atmosphere inside the load lock chamber 131 or the load lock chamber 132. The controller 170 opens the gate valve 167 or the gate valve 168, and controls the transfer mechanism 141 to transfer the wafer W in the load lock chamber 131 or the load lock chamber 132 to, for example, the carrier C in the load port 153, thereby accommodating the substrate W in the carrier C.

As described above, according to the processing system illustrated in FIG. 1, since the substrate W is not exposed to air while the substrate W is being processed by each processing chamber, a desired processing may be performed on the substrate W without breaking vacuum.

<Film Forming Apparatus>

Figure 2:
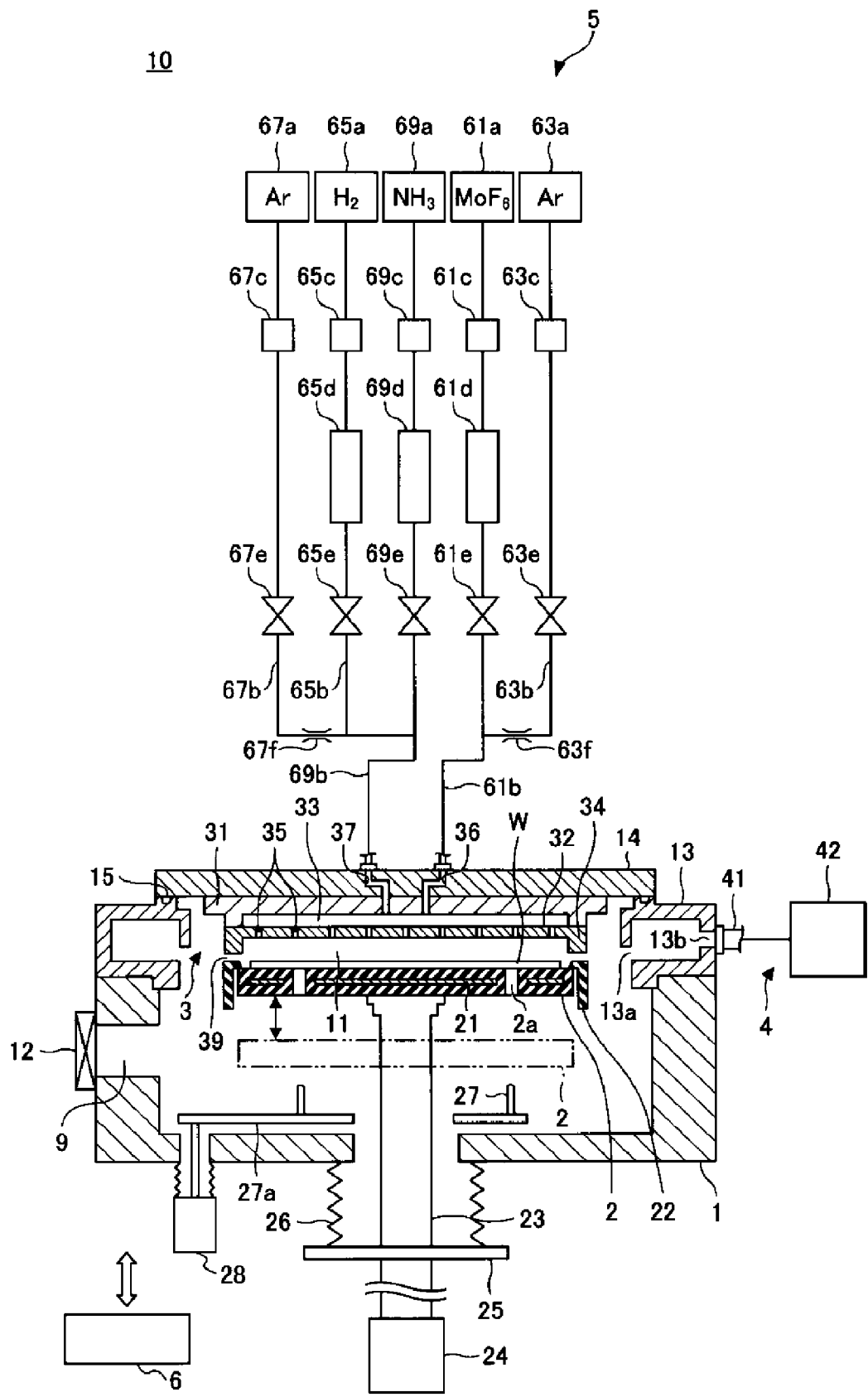
FIG. 2 is a vertical cross-sectional view of a film forming apparatus used in a film forming method according to an embodiment.

Next, an exemplary configuration of a film forming apparatus 10, by which at least one of the processing chambers 111 to 114 used in a film forming method according to an embodiment is configured, will be described with reference to FIG. 2. FIG. 2 is a vertical cross-sectional view of the film forming apparatus 10 used in the film forming method according to the embodiment.

The film forming apparatus 10 is a film forming apparatus that forms a molybdenum (Mo) film. The film forming apparatus 10 performs a treatment as a preprocessing of a film forming process of forming a molybdenum film, in the same processing chamber. However, the preprocessing may be performed in a separate processing chamber different from that for performing the film forming process of forming the molybdenum film.

The present apparatus does not use plasma. The film forming apparatus 10 directly forms a molybdenum film on an aluminum oxide ($Al_3O_2$) layer (hereinafter, also referred to as an "alumina layer") on a substrate W through an atomic layer deposition (ALD) method. Hereinafter, forming a desired metal film directly on a base film is also referred to as "direct film formation." The film forming apparatus 10 may directly form a molybdenum film on an alumina layer on a substrate W through a chemical vapor deposition (CVD) method.

The film forming apparatus 10 includes a processing container 1, a stage 2, a shower head 3, an exhauster 4, a gas supply 5, and a controller 6. The processing container 1 of the film forming apparatus 10 is formed of a metal such as aluminum, and has a substantially cylindrical shape. The film forming apparatus 10 accommodates a substrate W. A loading and unloading port 9 is formed in a side wall of the processing container 1 of the film forming apparatus 10 so as to load and unload the substrate W therethrough, and is opened and closed by a gate valve 12. An annular exhaust duct 13 having a rectangular cross section is provided on a main body of the processing container 1. A slit 13a is formed in the exhaust duct 13 along an inner peripheral surface of the exhaust duct 13. An exhaust port 13b is formed in an outer wall of the exhaust duct 13. On a top surface of the exhaust duct 13, a ceiling wall 14 is provided so as to close an upper opening of the processing container 1. A space between the exhaust duct 13 and the ceiling wall 14 is hermetically sealed with a seal ring 15.

The stage 2 horizontally supports the substrate W in the film forming apparatus 10. The stage 2 is formed in a disk shape having a size corresponding to the substrate W. The stage 2 is formed of a ceramic material such as aluminum nitride (AlN), or a metallic material such as an aluminum or nickel alloy. A heater 21 is embedded in the stage 2 so as to heat the substrate W. The heater 21 generates heat by being supplied with power from a heater power supply. An output of the heater 21 is controlled by a temperature signal from a thermocouple provided in the vicinity of a top surface of the stage 2, thereby controlling a temperature of the substrate W to a predetermined temperature. The stage 2 is provided with a cover 22 formed of ceramic such as alumina so as to cover an outer peripheral region of the top surface and a side surface of the stage 2.

The stage 2 is supported by a support 23. The support 23 extends downward from a center of a bottom surface of the stage 2 to below the processing container 1 via a hole formed in a bottom wall of the processing container 1, and a lower end of the support 23 is connected to a lifting mechanism 24. The stage 2 is moved vertically by the lifting mechanism 24 via the support 23, between a processing position illustrated in FIG. 2 and a transfer position, which is indicated by the two-dot chain line below the processing position and allows the substrate W to be transferred. Below the processing container 1, a flange 25 is installed on the support 23. A bellows 26, which partitions an atmosphere in the film forming apparatus 10 from an external atmosphere and expands and contracts in response to a vertical movement of the stage 2, is provided between the bottom surface of the processing container 1 and the flange 25.

A plurality of support pins 27 is provided in the vicinity of the bottom surface of the processing container 1 so as to protrude upward from a lifting plate 27a. The support pins 27 are moved vertically via the lifting plate 27a by a lifting mechanism 28 provided below the processing container 1. The support pins 27 are configured to be inserted into through-holes 2a formed in the stage 2 located at the transfer position so as to protrude and retract with respect to the top surface of the stage 2. By moving the support pins 27 vertically as described above, the substrate W is delivered between a transfer mechanism (not illustrated) and the stage 2.

The shower head 3 supplies a processing gas into the film forming apparatus 10 in the form of a shower. The shower head 3 is formed of a metal and is provided to face the stage 2. The shower head 3 has a diameter substantially equal to that of the stage 2. The shower head 3 has a main body 31 fixed to the ceiling wall 14 of the film forming apparatus 10, and a shower plate 32 disposed below the main body 31 and connected to the main body 31. A gas diffusion space 33 is formed between the main body 31 and the shower plate 32, and is in communication with gas introduction holes 36 and 37 which are provided to penetrate centers of the main body 31 and the ceiling wall 14 of the film forming apparatus 10. An annular protrusion 34 protruding downward is formed on a peripheral edge portion of the shower plate 32. Gas ejection holes 35 are formed in a flat surface of the inward side of the annular protrusion 34. In a state in which the stage 2 is located at the processing position, a processing chamber 11 is formed between the stage 2 and the shower plate 32, and a top surface of the cover 22 and the annular protrusion 34 approach each other so as to form an annular gap 39.

The exhauster 4 evacuates the interior of the film forming apparatus 10. The exhauster 4 includes an exhaust pipe 41 connected to the exhaust port 13b, and an exhaust mechanism 42 connected to the exhaust pipe 41 and having, for example, a vacuum pump or a pressure control valve. During processing, a gas in the film forming apparatus 10 reaches the exhaust duct 13 via the slit 13a, and is exhausted from the exhaust duct 13 by the exhaust mechanism 42 via the exhaust pipe 41.

The gas supply 5 supplies the processing gas into the film forming apparatus 10. The gas supply 5 is connected to the gas introduction holes 36 and 37 and configured to supply various gases for use in forming the molybdenum film. For example, the gas supply 5 includes, as gas supply parts for forming the molybdenum film, a Mo-containing gas source 61a, an Ar gas source 63a, a hydrogen-containing gas source 65a, and an Ar gas source 67a. In addition, as gas supply parts for use in the treatment processing as the preprocessing for the film forming process of the molybdenum film, a nitrogen-containing gas source 69a and the Ar gas sources 63a and 67a are provided.

The Mo-containing gas source 61a supplies a Mo-containing gas as a raw material gas into the processing container 1 via a gas line 61b. For example, the Mo-containing gas may be $MoF_6$ gas. The gas line 61b is provided with a flow rate controller 61c, a storage tank 61d, and a valve 61e from an upstream side. A downstream side of the valve 61e of the gas line 61b is connected to the gas introduction hole 36. The $MoF_6$ gas supplied from the Mo-containing gas source 61a is temporarily stored and boosted to a predetermined pressure in the storage tank 61d before being supplied into the processing container 1, and is then supplied into the processing container 1. Supplying the $MoF_6$ gas from the storage tank 61d into the processing container 1 and stopping the supply of the $MoF_6$ gas are performed by the valve 61e. By temporarily storing the $MoF_6$ gas in the storage tank 61d as described above, it is possible to stably supply the $MoF_6$ gas into the processing container 1 at a relatively large flow rate.

The Ar gas source 63a supplies Ar gas as a carrier gas into the processing container 1 via a gas line 63b. The gas line 63b is provided with a flow rate controller 63c, a valve 63e, and an orifice 63f from an upstream side. A downstream side of the orifice 63f of the gas line 63b is connected to the gas line 61b. The Ar gas supplied from the Ar gas source 63a is continuously supplied into the processing container 1 during the treatment processing and the film forming process on the substrate W. Supplying the Ar gas from the Ar gas source 63a into the processing container 1 and stopping the supply of the Ar gas are performed by the valve 63e. Although a relatively large flow rate of gas is supplied to the gas line 61b by the storage tank 61d, the gas supplied to the gas line 61b is prevented from flowing back to the gas line 63b by the orifice 63f.

The hydrogen-containing gas source 65a supplies a hydrogen-containing gas as a reducing gas into the processing container 1 via a gas line 65b. As the hydrogen-containing gas, for example, $H_2$ gas or $B_2H_6$ gas may be used. For example, the hydrogen-containing gas source 65a supplies $H_2$ gas into the processing container 1. The gas line 65b is provided with a flow rate controller 65c, a storage tank 65d, and a valve 65e from an upstream side. A downstream side of the valve 65e of the gas line 65b is connected to a gas line 69b. A downstream side of the gas line 69b is connected to the gas introduction hole 37. The $H_2$ gas supplied from the hydrogen-containing gas source 65a is temporarily stored and boosted to a predetermined pressure in the storage tank 65d before being supplied into the processing container 1, and is then supplied into the processing container 1. Supplying the $H_2$ gas from the storage tank 65d into the processing container 1 and stopping the supply of the $H_2$ gas are performed by the valve 65e. By temporarily storing the $H_2$ gas in the storage tank 65d as described above, it is possible to stably supply the $H_2$ gas into the processing container 1 at a relatively large flow rate.

The Ar gas source 67a supplies Ar gas as a carrier gas into the processing container 1 via a gas line 67b. The gas line 67b is provided with a flow rate controller 67c, a valve 67e, and an orifice 67f from an upstream side. A downstream side of the orifice 67f of the gas line 67b is connected to the gas line 69b. The Ar gas supplied from the Ar gas source 67a is continuously supplied into the processing container 1 during the treatment processing and the film forming process on the substrate W. Supplying the Ar gas from the Ar gas source 67a into the processing container 1 and stopping the supply of the Ar gas are performed by the valve 67e. A relatively large flow rate of gases are supplied to the gas line 65b and the gas line 69b by the storage tank 65d and a storage tank 69d. However, the gases supplied to the gas line 65b and the gas line 69b are prevented from flowing back to the gas line 67b by the orifice 67f.

The nitrogen-containing gas source 69a supplies a nitrogen-containing gas into the processing container 1 via the gas line 69b. The nitrogen-containing gas may be, for example, $NH_3$ gas, $N_2$ gas, $N_2H_4$ gas, or $CH_3(NH)NH_2$ gas. The nitrogen-containing gas includes at least one of the gases described above. Among the gases described above, it is desirable to use a highly reactive gas such as $NH_3$ gas, $N_2H_4$ gas, or $CH_3(NH)NH_2$ gas, because an alumina layer as a base film can be easily terminated by nitrogen atoms. For example, the nitrogen-containing gas source 69a supplies $NH_3$ gas into the processing container 1.

The gas line 69b is provided with a flow rate controller 69c, the storage tank 69d, and a valve 69e from an upstream side. A downstream side of the valve 69e of the gas line 69b is connected to the gas introduction hole 37. The $NH_3$ gas supplied from the nitrogen-containing gas source 69a is temporarily stored and boosted to a predetermined pressure in the storage tank 69d before being supplied into the processing container 1, and is then supplied into the processing container 1. Supplying the $NH_3$ gas from the storage tank 69d into the processing container 1 and stopping the supply of the $NH_3$ gas are performed by the valve 69e. By temporarily storing the $NH_3$ gas in the storage tank 69d as described above, it is possible to stably supply the $NH_3$ gas into the processing container 1 at a relatively large flow rate.

Operations of the film forming apparatus 10 configured as described above are controlled overall by the controller 6. The controller 6 is, for example, a computer, and includes, for example, a central processing unit (CPU), a random access memory (RAM), a read only memory (ROM), and an auxiliary storage device. The CPU operates based on a program stored in the ROM or the auxiliary storage device, and controls the overall operations of the apparatus. The controller 6 may be provided either inside or outside the film forming apparatus 10. In a case where the controller 6 is provided outside the film forming apparatus 10, the controller 6 can control the film forming apparatus 10 by wired or wireless communication means.

The film forming apparatus 10 configured as described above may be an internal structure of at least one of the processing chambers 111, 112, 113, and 114 of FIG. 1. The nitrogen-containing gas source 69a and the gas line 69b of the film forming apparatus 10 may not be provided in the film forming apparatus 10. In this case, at least one of the processing chambers 111, 112, 113, and 114 of FIG. 1 has an internal structure capable of supplying a nitrogen-containing gas.

[Film Forming Method]

Next, a method of forming a molybdenum film, which is performed using the film forming system configured as described above, will be described with reference to FIGS. 3 to 5B. FIG. 3 is a flowchart illustrating a flow of respective processes of a film forming method according to an embodiment. FIGS. 4A to 4D are cross-sectional views schematically illustrating states of a substrate in respective processes of a film forming method according to an embodiment. FIGS. 5A and 5B are views schematically illustrating a state in which a surface of an alumina layer according to an embodiment is N-terminated. The process of FIG. 3 is controlled by the controller 6 of the film forming apparatus 10.

Figure 4A:
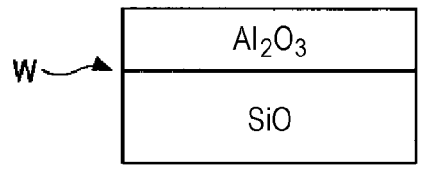
FIGS. 4A to 4D are cross-sectional views schematically illustrating states of a substrate in respective processes of a film forming method according to an embodiment.

First, in the film forming method according to the present embodiment, the film forming apparatus 10 is provided with a substrate W having an alumina ($Al_2O_3$) layer as a base film formed on a silicon oxide layer (step S1 in FIG. 3, and FIG. 4A). Although a recess such as a trench or a hole (a contact hole or a via hole) is formed in the substrate W actually, the recess is omitted in FIGS. 4A to 4D for the sake of convenience.

Figure 4B:
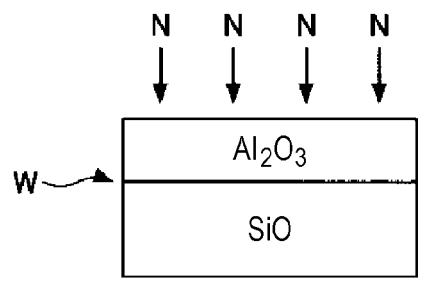
Figure 4C:
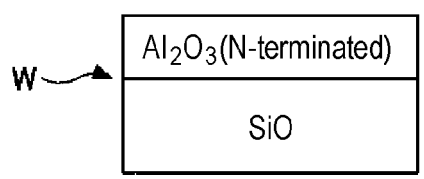
Figure 5A:
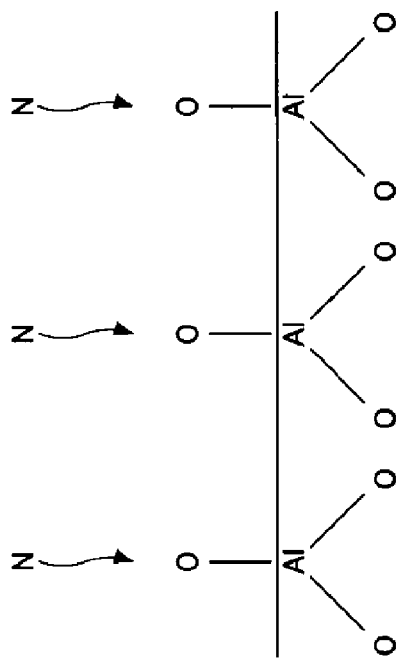
FIGS. 5A and 5B are views schematically illustrating a state in which a surface of an alumina layer according to an embodiment is N-terminated.
Figure 5B:
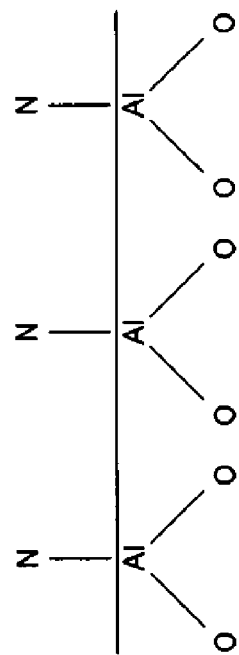

Subsequently, the film forming apparatus 10 supplies $NH_3$ gas into the processing container 1 before forming a film formed of a molybdenum-containing material on the substrate W (preprocessing: step S2 in FIG. 3, and FIGS. 4B and 4C). Thus, as illustrated in FIG. 5A, nitrogen atoms in the $NH_3$ gas are supplied to a surface of the alumina layer. As a result, as illustrated in FIG. 5B, oxygen atoms on the surface of the alumina layer are replaced with nitrogen atoms, and the surface of the alumina layer is N-terminated. The preprocessing in step S2 is a process of N-terminating the surface of the alumina layer, which is also referred to as "treatment processing."

In the preprocessing of step S2, for example, the $NH_3$ gas is supplied as a nitrogen-containing gas to the substrate W heated by a heating device. An example of the heating device may be the heater 21 shown in FIG. 2. As will be described later, it is desirable that the substrate W is heated to 530 degrees C. or higher by the heater 21.

Figure 4D:
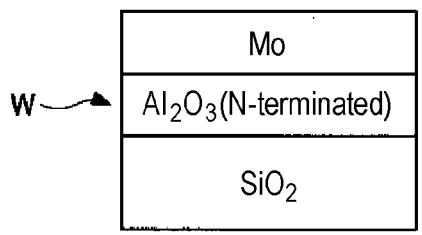

After performing the treatment processing on the surface of the alumina layer through the process of step S2, the film forming apparatus 10 forms a molybdenum film on the substrate W (step S3 in FIG. 3, and FIG. 4D). For example, the film forming apparatus 10 supplies a raw material gas of $MoF_6$ gas and a reducing gas of $H_2$ gas into the processing container 1 so as to form the molybdenum film. As a result, it is possible to directly form the molybdenum film on the surface of the alumina layer.

In step S3, the raw material gas containing molybdenum and the reducing gas are alternately supplied a plurality of times so as to form the molybdenum film through an atomic layer deposition (ALD) method of forming the molybdenum film on the alumina layer.

[Preprocessing]

Figure 6:
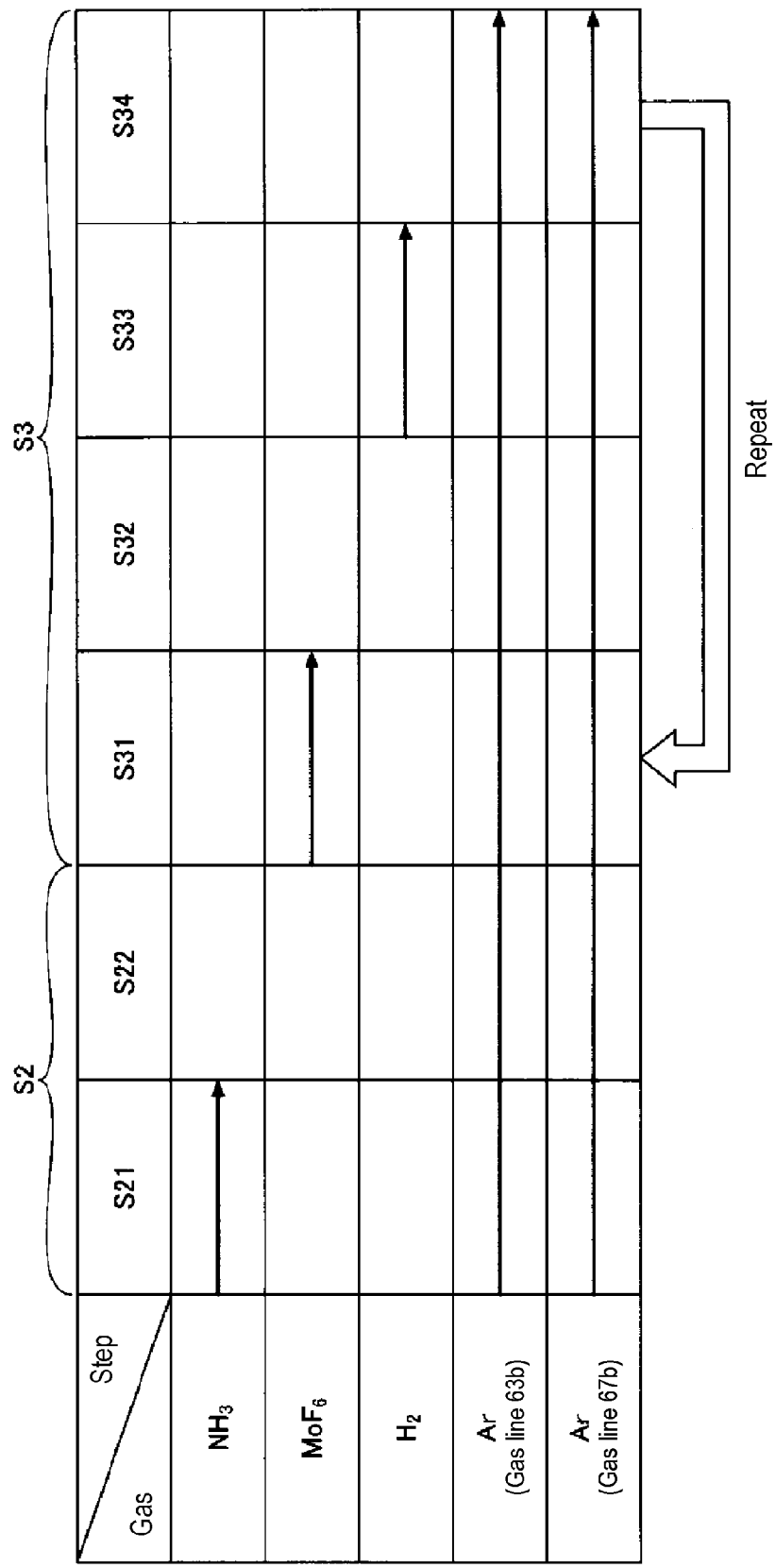
FIG. 6 is a view illustrating a gas supply sequence when forming a molybdenum film according to an embodiment.

A flow until the film forming apparatus 10 forms a molybdenum film will be described with reference to FIG. 6. FIG. 6 is a view illustrating a gas supply sequence when forming a molybdenum film according to an embodiment.

In the preprocessing, the controller 6 of the film forming apparatus 10 controls the heater 21 of the stage 2 to heat the substrate W to a desired temperature (e.g., 530 degrees C. or higher). In addition, the controller 6 controls the pressure control valve of the exhaust mechanism 42 to adjust a pressure inside the processing container 1 to a desired pressure (e.g., 50 Torr (6.67 Pa) or higher).

A flow of the preprocessing will be described by dividing the flow into steps S21 and S22 in FIG. 6. In the preprocessing, first, as illustrated in step S21 in FIG. 6, the $NH_3$ gas and the carrier gas (Ar gas) are supplied. That is, the controller 6 opens the valves 63e and 67e illustrated in FIG. 2 to supply the carrier gas (Ar gas) of a desired flow rate (e.g., 100 to 10,000 sccm) from the Ar gas sources 63a and 67a to the gas lines 63b and 67b, respectively. In addition, the controller 6 opens the valve 69e to supply the $NH_3$ gas at a desired flow rate (e.g., a flow rate of 5,000 sccm or higher) from the nitrogen-containing gas source 69a to the gas line 69b. At this time, the $NH_3$ gas temporarily stored in the storage tank 69d is stably supplied into the processing container 1 at a relatively large flow rate. Thus, the surface of the alumina layer is N-terminated as $Al_2O_3 \rightarrow AlN$ by nitrogen atoms in the $NH_3$ gas supplied to the surface of the alumina layer. At this time, since the valves 61e and 65e are closed, the $MoF_6$ gas and the $H_2$ gas are stored in the storage tanks 61d and 65d, respectively, and the pressures in the storage tanks 61d and 65d are boosted.

After a desired time (e.g., 1,800 to 3,600 seconds) has elapsed in step S21, the controller 6 closes the valve 69e and stops the supply of the $NH_3$ gas into the processing container 1 (step S22). By closing the valve 69e, the $NH_3$ gas supplied from the nitrogen-containing gas source 69a is stored in the storage tank 69d, and the pressure inside the storage tank 69d is boosted. At this time, since the valves 63e and 67e are still in the open state, the carrier gas (Ar gas) having a desired flow rate (e.g., 100 to 10,000 sccm) is supplied from the Ar gas sources 63a and 67a to the gas lines 63b and 67b, respectively.

[Formation of Molybdenum Film Through ALD Method]

When the preprocessing (treatment processing) is performed and the surface of the alumina layer is N-terminated by nitrogen atoms, it is possible to directly form a molybdenum film on the surface of the alumina layer. Next, a flow in which the film forming apparatus 10 forms a molybdenum film on the surface of the N-terminated alumina layer through an ALD method after the preprocessing will be described by dividing the flow into steps S31 to S34 in FIG. 6.

After a desired time (e.g., 0.1 to 10 seconds) has elapsed from closing the valve 69e in step S22, the valve 61e is opened and the $MoF_6$ gas stored in the storage tank 61d is supplied from the gas line 61b into the processing container 1 so that a film formed of a molybdenum-containing material is adsorbed on the surface of the substrate W (FIG. 6, step S31). At this time, since the valves 63e and 67e are still in the open state, the carrier gas (Ar gas) having a desired flow rate (e.g., 100 to 10,000 sccm) is supplied from the Ar gas sources 63a and 67a to the gas lines 63b and 67b, respectively.

After a desired time (e.g., 0.1 sec to 10 seconds) elapses from opening the valve 61e, the controller 6 closes the valve 61e to stop the supply of the $MoF_6$ gas into the processing container 1 (step S32 in FIG. 6). By closing the valve 61e, the $MoF_6$ gas supplied from the Mo-containing gas source 61a to the gas line 61b is stored in the storage tank 61d, and the pressure inside the storage tank 61d is boosted. In addition, by closing the valve 61e, the carrier gas (Ar) supplied from the gas line 63b and the gas line 67b also functions as a purge gas so that excess $MoF_6$ gas can be exhausted (step S32 in FIG. 6).

After a desired time (e.g., 0.1 to 10 seconds) elapses from closing the valve 61e, the controller 6 opens the valve 65e to supply the $H_2$ gas stored in the storage tank 65d into the processing container 1 and to reduce the $MoF_6$ gas adsorbed on the surface of the substrate W (step S33 in FIG. 6). At this time, since the valves 63e and 67e are still in the open state, the carrier gas (Ar gas) having a desired flow rate (e.g., 100 to 10,000 sccm) is supplied from the Ar gas sources 63a and 67a to the gas lines 63b and 67b, respectively.

After a desired time (e.g., 0.1 sec to 10 sec) elapses from opening the valve 65e, the controller 6 closes the valve 65e to stop the supply of the $H_2$ gas into the processing container 1 (step S34 in FIG. 6). By closing the valve 65e, the $H_2$ gas supplied from the hydrogen-containing gas source 65a to the gas line 65b is stored in the storage tank 65d, and the pressure inside the storage tank 65d is boosted. In addition, by closing the valve 61e, the carrier gas (Ar) supplied from the gas line 63b and the gas line 67b also functions as a purge gas so that excess $H_2$ gas can be exhausted (step S34 in FIG. 6).

The controller 6 repeats a cycle including steps S31 to S34 a plurality of times (e.g., 10 to 1,000 cycles) so as to form a molybdenum film having a desired film thickness. For example, when $MoF_6$ gas is used as the Mo-containing gas, the $MoF_6$ gas reacts as $MoF_6(g)+3H_2(g) \rightarrow Mo(s)+6HF(g)$, and a metal film of molybdenum is adsorbed on the surface of the substrate W.

The gas supply sequence and conditions of the processing gases when forming the molybdenum film shown in FIG. 6 are merely examples, and the present disclosure is not limited thereto. The molybdenum film may be formed using other gas supply sequences and conditions of the processing gas.

[Operations and Effects]

Figure 7:
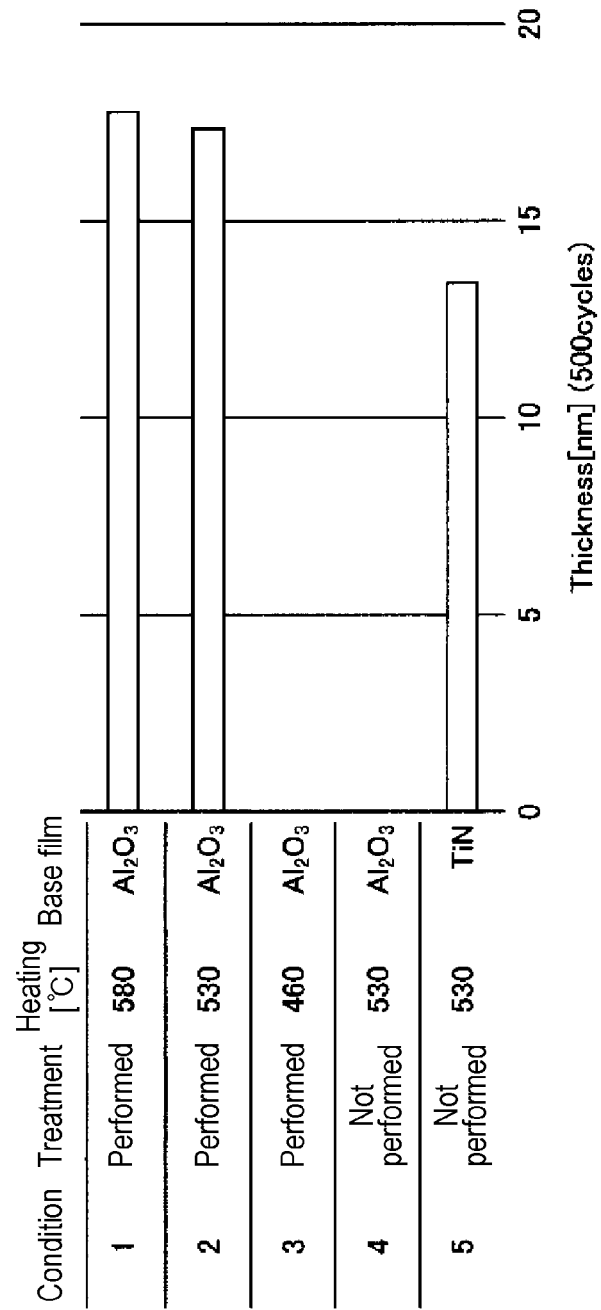
FIG. 7 is a view showing experimental results of direct film formation through a film forming method according to an embodiment.

Next, operations and effects of the film forming method according to the present embodiment will be described. FIG. 7 is a view showing experimental results of direct film formation on a base film through the film forming method according to the embodiment in comparison with a reference example.

Here, examples of process conditions of the film forming method according to an embodiment will be summarized and described below.

Condition 1: Present Embodiment

Base film alumina ($Al_2O_3$)
Treatment (preprocessing)
    Substrate temperature: 580 degrees C.
    Pressure: 50 Torr (6.67 kPa)
    Treatment time: 1,800 seconds
    Gas: $NH_3$ gas
Formation of Mo film
    Substrate temperature: 580 degrees C.
    Pressure: 50 Torr (6.67 kPa)
    $MoF_6$ gas: 2.3 sccm/1 cycle (500 cycles)
    Carrier gas (Ar): 1,000 to 20,000 sccm
    $H_2$ gas: 1,000 to 10,000 sccm
    Time:
    $MoF_6$ gas: 2 seconds
    Purge (Ar): 0.05 to 15 seconds
    $H_2$ gas: 0.05 to 15 seconds
    Purge (Ar): 0.05 to 15 seconds
    Number of cycles: 500 cycles Condition 2: Present Embodiment Base film alumina ($Al_2O_3$)
Treatment (preprocessing)
    Substrate temperature: 530 degrees C.
    Pressure: 50 Torr (6.67 kPa)

Treatment time: 1,800 seconds
Gas: NH$_3$ gas
Formation of Mo film
  Substrate temperature: 530 degrees C.
  Others are the same as those of Condition 1.

Condition 3: Present Embodiment

Base film alumina (Al$_2$O$_3$)
Treatment (preprocessing)
  Substrate temperature: 460 degrees C.
  Pressure: 7 Torr (0.933 kPa)
  Treatment time: 600 seconds
  Gas: NH$_3$ gas
Formation of Mo film
  Substrate temperature: 460 degrees C.
  Others are the same as those of Condition 1.

Condition 4: Reference Example

Base film alumina (Al$_2$O$_3$)
No treatment (preprocessing) (in addition, a base film was annealed at 800 degrees C. before film formation)
Formation of Mo film
  Substrate temperature: 530 degrees C.
  Others are the same as those of Condition 1.

Condition 5: Reference Example

Base film titanium nitride (TiN)
No treatment (preprocessing)
Formation of tungsten (W) film
  Substrate temperature: 450 degrees C.
  Pressure: 0.1 to 20 Torr (13.33 to 2,666 Pa)
  WF$_6$ gas: 100 to 500 sccm (total flow rate of 500 cycles)
  Carrier gas (N$_2$): 1,000 to 10,000 sccm
  H$_2$ gas: 500 to 20,000 sccm
  Time:
  WF$_6$ gas: 0.05 to 15 seconds
  Purge (N$_2$): 0.05 to 15 seconds
  H$_2$ gas: 0.05 to 15 seconds
  Purge (N$_2$): 0.05 to 15 seconds In FIG. 7, the horizontal axis represents a film thickness of a metal film formed on each of base films based on Conditions 1 to 5 described above. In the reference example of Condition 5, a tungsten (W) film was directly formed on a titanium nitride layer without performing a treatment processing.

In the reference example of Condition 4, a Mo film could not be directly formed on an alumina layer without performing a treatment processing as a preprocessing. That is, it was confirmed that in order to perform direct film formation of the Mo film on the alumina layer, it is necessary to N-terminate the surface of the alumina layer by nitrogen atoms before forming the Mo film.

In the present embodiment of Conditions 1 and 2, in the treatment processing, the substrate temperature was controlled to 530 degrees C. or 580 degrees C., the pressure in the processing container 1 was controlled to 50 Torr, and the treatment time was controlled to about 1,800 seconds. As a result, a Mo film was directly formed on an alumina layer. In contrast, in the case of Condition 3, when the substrate temperature, the pressure in the processing container 1, and the treatment time were controlled to 460 degrees C., 7 Torr, and 600 seconds, respectively, in the treatment processing, no Mo film was directly formed on an alumina layer.

From the experimental results described above, it is considered that, when the substrate temperature was controlled to 460 degrees C., no Mo film was directly formed because the surface of the alumina layer was not N-terminated even if the NH$_3$ gas is exposed to the surface of the alumina layer. From the foregoing, it is desirable to control the substrate temperature to 530 degrees C. or higher in the preprocessing. In addition, it is desirable to control the pressure in the processing container 1 to 50 Torr or more in the preprocessing. This makes it possible to directly form a Mo film on a surface of an alumina layer.

In recent years, a line width and space of wiring have decreased due to miniaturization of devices, and due to the decrease in line width and space of wiring, it is desired to further reduce the resistance of wiring. When forming a metal film during a wiring process, as represented in the reference example, direct film formation of a tungsten film on a titanium nitride layer has been conventionally performed.

However, when the base film is an insulating film, direct film formation on the insulating film could not be performed in the past. Therefore, a titanium nitride film has been formed on an insulating film, and a metal film has been formed on the titanium nitride film. In this case, the titanium nitride film was formed as a barrier layer having high resistance.

A line width of next-generation wiring will be further reduced to, for example, about 15 nm. When a proportion of a barrier layer or the like increases, a region of a molybdenum film that can be used for wiring becomes narrower, and problems such as disconnection are likely to occur. Therefore, direct wiring, in which a barrier layer is eliminated and a molybdenum film is directly formed on a surface of an insulating film such as an alumina layer, is desired. In addition, molybdenum is attracting attention as a candidate for a metal film for next-generation wiring.

Therefore, in the present embodiment, the molybdenum film is directly formed on the alumina layer by performing a surface processing (treatment) of a target alumina layer as a preprocessing. This enables a process with low wiring resistance. That is, a surface treatment using NH$_3$ gas is performed on a surface of the alumina layer to N-terminate the surface as Al$_2$O$_3$→AlN. Thereafter, a molybdenum film is directly formed on the surface of the N-terminated alumina layer. As a result, since it is unnecessary to form a barrier layer, a seed layer, or the like between the alumina layer and the molybdenum film, it is possible to secure a wiring space, and to achieve wiring of a low resistance molybdenum film on an insulating layer.

It is also conceivable to use molybdenum oxychloride (MoO$_2$Cl$_2$) instead of MoF$_6$ gas to perform wiring of a molybdenum film. However, since MoO$_2$Cl$_2$ is a solid raw material, MoO$_2$Cl$_2$ is not easy to handle and is expensive. In contrast, since MoF$_6$ is a liquid raw material, MoF$_6$ is easy to handle and is inexpensive. From the foregoing, it is desirable to use MoF$_6$ gas as a raw material for a molybdenum film.

[Base Film Dependence of Direct Film Formation]

Figure 8:
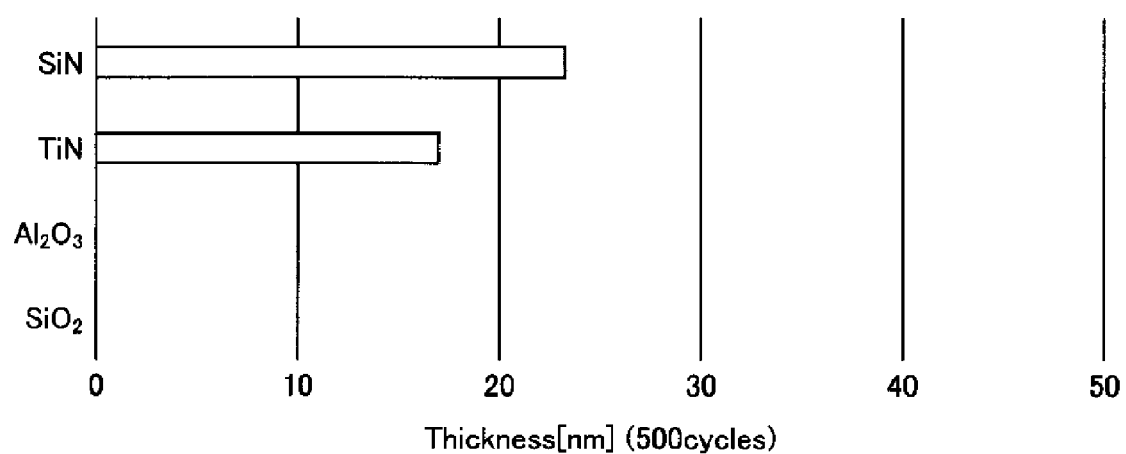
FIG. 8 is a view showing experimental results of base film dependence of direct film formation according to an embodiment.

Next, base film dependence of direct film formation through a film formation method of the present embodiment will be described with reference to FIG. 8. FIG. 8 is a view showing experimental results of base film dependence of direct film formation according to an embodiment.

In FIG. 8, the horizontal axis represents a film thickness of a molybdenum film formed on each base film through the film forming method according to the present embodiment. In the experiments of FIG. 8, a molybdenum film was formed through step S3 (S31 to S32) in FIG. 6 of the film forming method according to the present embodiment without performing the preprocessing of step S2 (S21 to S22) on each base film. Process conditions for the molybdenum film are the same as those of Condition 1. In addition, as a reference example, a case where a tungsten film was directly formed on a titanium nitride layer serving as a base film is also shown. Process conditions for the tungsten film in this case are the same as those of Condition 5.

As a result of the experiments, when the base films were an alumina layer and a silicon oxide layer ($SiO_2$), no molybdenum film was directly formed on each of the base films. In contrast, when the base film was a silicon nitride layer (SiN), a molybdenum film was directly formed on the base film. In this case, a thickness of the molybdenum film was comparable to or thicker than a thickness of the tungsten film directly formed on the titanium nitride layer shown as the reference example.

Figure 9A:
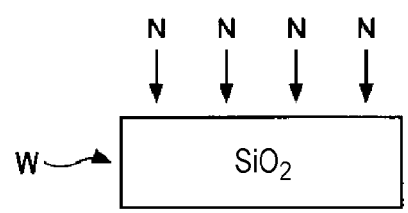
FIGS. 9A and 9B are cross-sectional views schematically illustrating states of a substrate in respective processes of a film forming method according to an embodiment.
Figure 9B:
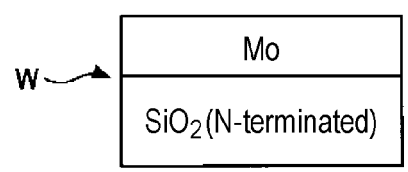

From the foregoing, as illustrated in FIG. 9A, when a silicon oxide layer is formed on a substrate W, it is possible to directly form a molybdenum film on the silicon oxide layer by performing a surface processing (treatment) for the target silicon oxide layer as a preprocessing. That is, in the preprocessing of the film forming method according to the present embodiment, a surface treatment is performed on a surface of the silicon oxide layer by supplying a nitrogen-containing gas to N-terminate the surface as $SiO_2 \rightarrow SiN$. Thereafter, as illustrated in FIG. 9B, a molybdenum film is directly formed on the surface of the N-terminated silicon oxide layer.

Accordingly, since it is unnecessary to form a barrier layer or the like between a silicon oxide layer and a molybdenum film, it is possible to secure a low-resistance wiring space for forming the molybdenum film. Thus, it is possible to achieve wiring of a low-resistance molybdenum film on an insulating layer.

Modification

Figure 10A:
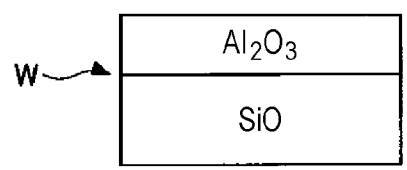
FIGS. 10A to 10C are cross-sectional views schematically showing states of a substrate in respective processes of a film forming method according to a modification of an embodiment.
Figure 10B:
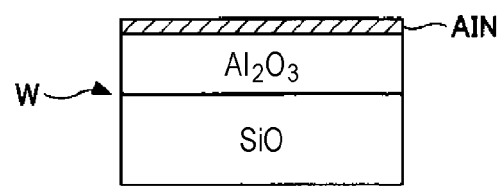
Figure 10C:
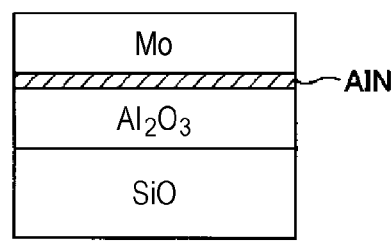

Finally, a film forming method according to a modification of an embodiment will be described with reference to FIGS. 10A to 10C. FIGS. 10A to 10C are cross-sectional views schematically showing states of a substrate in respective processes of a film forming method according to a modification of an embodiment.

In the present modification, first, as illustrated in FIG. 10A, a substrate W having an alumina layer as a base film formed on a silicon oxide substrate is prepared.

The film forming apparatus 10 supplies an Al-containing gas and a nitrogen-containing gas as a preprocessing to form an aluminum nitride (AlN) film on the alumina layer before forming a film formed of a molybdenum-containing material on the substrate W. For example, trimethylaluminum (TMA: $(CH_3)_3Al$) is supplied into the processing container 1 as the Al-containing gas. For example, $NH_3$ gas is supplied into the processing container 1 as the nitrogen-containing gas.

As a result, a thin film of aluminum nitride is formed on the alumina layer, as illustrated in FIG. 10B. After the preprocessing, the film forming apparatus 10 forms a molybdenum film on the substrate W (step S3 in FIG. 6). For example, the film forming apparatus 10 supplies a raw material gas ($MoF_6$ gas) and a reducing gas ($H_2$ gas) into the processing container 1 to form the molybdenum film. Thus, it is possible to form the molybdenum film on a surface of the alumina layer with a thin film of the aluminum nitride film interposed therebetween.

As described above, according to the film forming method of the present embodiment, by preprocessing an alumina layer on a substrate, which has been heated to a desired temperature, it is possible to directly form a molybdenum film on the alumina layer. Thus, it is possible to achieve wiring of a low-resistance molybdenum film.

It should be considered that the film forming method and the film forming apparatus according to the embodiments disclosed herein are illustrative and not restrictive in all aspects. The embodiments described above may be modified and improved in various forms without departing from the scope and spirit of the appended claims. The matters described in the above embodiments may take other configurations to the extent they are not inconsistent, and may be combined to the extent they are not inconsistent.

According to the present disclosure, it is possible to directly form a molybdenum film on an aluminum oxide layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
   (a) preparing a substrate having an oxide layer formed on the substrate;
   (b) supplying a nitrogen-containing gas to the substrate heated by a heater; and
   (c) forming a molybdenum film on the oxide layer by alternately supplying a raw material gas containing molybdenum and a reducing gas a plurality of times,
   wherein (c) includes forming the molybdenum film through atomic layer deposition (ALD),
   wherein the oxide layer is an aluminum oxide layer, and
   wherein (b) includes N-terminating the aluminum oxide layer by the nitrogen-containing gas.

2. The film forming method of claim 1, wherein (b) includes forming an aluminum nitride film on the aluminum oxide layer by the nitrogen-containing gas.

3. The film forming method of claim 2, wherein in (b), the nitrogen-containing gas includes at least one gas selected from a group consisting of $NH_3$ gas, $N_2$ gas, $N_2H_4$ gas, and $CH_3(NH)NH_2$ gas.

4. The film forming method of claim 3, wherein (b) includes heating the substrate to 530 degrees C. or higher.

5. The film forming method of claim 4, wherein (b) includes keeping a pressure inside a processing container into which the nitrogen-containing gas is supplied at 50 Torr or higher.

6. The film forming method of claim 5, wherein (b) includes supplying the raw material gas at a flow rate of 2.3 sccm or more for each cycle.

7. The film forming method of claim 6, wherein in (c), the raw material gas is $MoF_6$ gas and the reducing gas is $H_2$ gas.

8. A film forming method comprising:
   (a) preparing a substrate having an oxide layer formed on the substrate;
   (b) supplying a nitrogen-containing gas to the substrate heated by a heater; and (c) forming a molybdenum film on the oxide layer by alternately supplying a raw material gas containing molybdenum and a reducing gas a plurality of times, wherein the oxide layer is an aluminum oxide layer, and wherein (b) includes forming an aluminum nitride film on the aluminum oxide layer by the nitrogen-containing gas.

9. The film forming method of claim 8, wherein in (b), the nitrogen-containing gas includes at least one gas selected from a group consisting of $NH_3$ gas, $N_2$ gas, $N_2H_4$ gas, and $CH_3(NH)NH_2$ gas.

10. The film forming method of claim 8, wherein (b) includes heating the substrate to 530 degrees C. or higher.

11. The film forming method of claim 8, wherein (b) includes keeping a pressure inside a processing container into which the nitrogen-containing gas is supplied at 50 Torr or higher.

12. The film forming method of claim 8, wherein (b) includes supplying the raw material gas at a flow rate of 2.3 sccm or more for each cycle.

13. The film forming method of claim 8, wherein in (c), the raw material gas is $MoF_6$ gas and the reducing gas is $H_2$ gas.

\* \* \* \* \*